United States Patent
Mayer et al.

(10) Patent No.: US 6,687,987 B2
(45) Date of Patent: Feb. 10, 2004

(54) ELECTRO-FLUIDIC ASSEMBLY PROCESS FOR INTEGRATION OF ELECTRONIC DEVICES ONTO A SUBSTRATE

(75) Inventors: Theresa S. Mayer, Port Matilda, PA (US); Thomas N. Jackson, State College, PA (US); Christopher D. Nordquist, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 241 days.

(21) Appl. No.: 09/875,443

(22) Filed: Jun. 6, 2001

(65) Prior Publication Data

US 2002/0005294 A1 Jan. 17, 2002

Related U.S. Application Data

(60) Provisional application No. 60/209,688, filed on Jun. 6, 2000.

(51) Int. Cl.[7] ................................................. H05K 3/30
(52) U.S. Cl. ............................. 29/832; 29/825; 29/593
(58) Field of Search ......................... 29/896, 593, 825, 29/832

(56) References Cited

U.S. PATENT DOCUMENTS

| | | | |
|---|---|---|---|
| 4,990,462 A | * 2/1991 | Sliva, Jr. | |
| 5,355,577 A | 10/1994 | Cohn | 29/592.1 |
| 5,545,291 A | 8/1996 | Smith et al. | 156/655.1 |
| 5,783,856 A | 7/1998 | Smith et al. | 257/618 |
| 5,808,330 A | * 9/1998 | Rostoker et al. | |
| 5,824,186 A | 10/1998 | Smith et al. | 156/655.1 |
| 5,904,545 A | 5/1999 | Smith et al. | 438/455 |

* cited by examiner

Primary Examiner—Carl J. Arbes
(74) Attorney, Agent, or Firm—Ohlandt, Greeley, Ruggiero & Perle LLP

(57) ABSTRACT

An electro-fluidic assembly process for integration of an electronic device or component onto a substrate which comprises: disposing components within a carrier fluid; attracting the components to an alignment sites on the substrate by means of electrophoresis or dielectrophoresis; and aligning the components within the alignment site by means of energy minimization. The substrate comprises: a biased backplane layer, a metal plane layer having one or more alignment sites, a first insulating layer disposed between the backplane layer and the metal plane layer, and a second insulating layer, e.g., benzocyclobute, having a recess disposed therein, wherein the second insulating layer is on the surface of the metal plane layer opposite from the first insulating layer and wherein the recess is in communication with the alignment site.

9 Claims, 10 Drawing Sheets

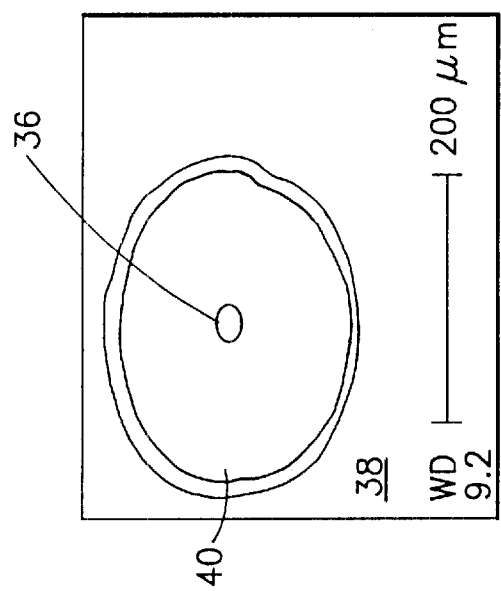
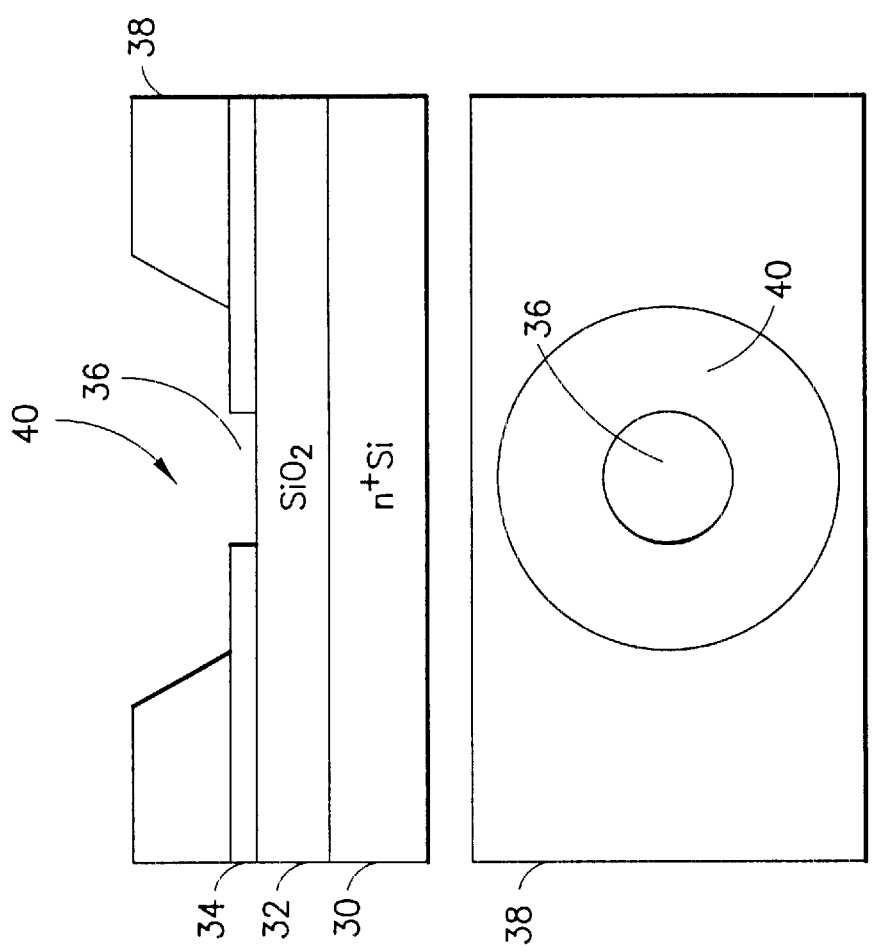
FIG.11b
FIG.11a

ELECTRO-FLUIDIC ASSEMBLY PROCESS FOR INTEGRATION OF ELECTRONIC DEVICES ONTO A SUBSTRATE

This application is based on and claims priority from U.S. Provisional Patent Application No. 60/209,688, filed on Jun. 6, 2000. The present invention generally relates to an electro-fluidic assembly process for integration of component onto a substrate which comprises: disposing components within a carrier fluid; attracting said components to an alignment site on said substrate by means of dielectrophoresis; and aligning said components within said alignment site by means of energy minimization.

BACKGROUND OF THE INVENTION

The incredible growth in Internet, wireless, and opto-electronic communications has created a need for low-cost, high-performance microsystems, capable of receiving, processing, and transmitting large amounts of data quickly and accurately. However, the increasing use of millimeter-wave and optical channels for communications has made highly integrated, all-silicon communication chips impossible, because of silicon's ineffectiveness in optical and ultra-high speed applications. Instead, these functions are performed with one of three types of circuits: hybrid circuits, monolithic microwave integrated circuits (MMICs), or opto-electronic integrated circuits (OEICs). Hybrid circuits include separate chips of different materials, such as silicon signal-processing chips and III-V electronic devices to perform optical or microwave functions. These hybrid chips require serial manufacturing techniques, such as pick-and-place and wire-bonding, which increase the cost, size, and complexity of the manufactured circuit. On the other hand, MMICs and OEICs perform not only the optical or microwave function, but also all of their data processing, on the GaAs or InP substrate, which results in inefficient utilization of the expensive III-V material. In order to continue reducing the cost and size of data transmission circuits, a technique for fabricating integrated circuits containing devices made of differing materials must be perfected.

Because of the potential for low-cost, multi-function integrated circuits, heterogeneous integration of silicon and other materials has been explored extensively. The benefits of heterogeneous integration include lower parasitic losses, lower system weight, lower packaging costs, and increased reliability. Ultimately, these benefits will provide reduced cost, higher performance microsystems.

The promise of increased performance has driven research in heterogeneous integration, with numerous unique and creative approaches developed to integrate silicon and III-V devices. These approaches include techniques in which the two different materials are combined early during the process, such as direct growth of III-V materials onto silicon, wafer bonding of silicon and GaAs wafers together, or transferring epitaxial layers onto silicon prior to device processing. Alternately, the III-V devices can be fabricated prior to transfer, and then transferred in processes such as epitaxial lift-off, applique, flip-chip, or fluidic assembly. As described below, each of these processes have potential, but process details limit their use to specific niche applications.

Because silicon and III-V materials are not lattice-matched and have different thermal properties, the growth of device-quality, large-area epitaxial layers on low-cost silicon substrates cannot be performed. However, limited area growth of device-quality III-V material through an opening in a silicon oxide layer has been demonstrated. Operating LEDs and VCSELs have been demonstrated on silicon wafers, and an LED and driver circuit have been integrated using this growth technique. However, devices grown using this technique contain a very high defect density and residual stress, which limits their lifetime. Also, the temperatures required for growth of III-V materials may degrade any existing silicon circuitry.

Wafer bonding has also been proposed, researched and demonstrated for numerous applications. At the device level, InP-InGaAsP lasers were fabricated using direct wafer bonding, while others have demonstrated dual-wavelength emitters by bonding GaN LEDs and InGaP lasers together, and then removing the GaAs substrate. Another wafer-bonding approach that integrates Si circuitry and GaAs devices is known as "Epitaxy on Electronics". In this approach, a GaAs and SOI wafers are bonded together. The Si wafer is removed, leaving a thin layer of silicon. CMOS devices are fabricated, an opening is etching in the silicon, and GaAs devices can be grown in the opening, processed, and then integrated with the CMOS circuitry. However, wafer bonding requires the use of entire wafers, so it is an inefficient use of the III-V wafer. Also, the thermal cycling required to grow material and fabricate devices generates stress in the bonded wafers, which in extreme cases may result in fracture.

Another unique procedure for heterogeneous integration is epitaxial lift-off (ELO). In this process, epitaxial material is released from the growth substrate by etching a sacrificial layer underneath the epitaxial layer, releasing it from the substrate. The epitaxial layer, typically supported by a wax or polymer membrane, is then bonded to the host substrate through van der Waals bonding. Depending upon the process requirements, the devices can be processed either before or after the transfer of the epitaxial layer to the host substrate. ELO has been reported by several groups for the integration of optical devices with silicon CMOS and for thermal management, but it has three unfortunate drawbacks. First, handling extremely thin epitaxial layers is difficult and tedious. Second, any pre-processed devices need to be aligned to existing circuitry on the host substrate, which is difficult and time-consuming when compounded with the thinness of the epitaxial film. Finally, it inefficiently utilizes material, because the entire epitaxial layer must be consumed in the transfer, regardless of the device density on the final circuit.

Applique can also be used to transfer epitaxial layers to other substrates, either before or after device processing. This procedure differs from ELO in that a surrogate substrate is used to support the epitaxial layers during the transfer step. Also, typically a thin metal solder film, rather than van der Waals forces, is used to attach the epitaxial material to the new substrate. This procedure has been used to fabricate some relatively complex heterogeneous circuits, but still has the problem of inefficient layer transfer. Also, while using a surrogate substrate adds rigidity to the material, it creates the need for a second substrate removal step.

Currently, the most common and successful practice for aligning individual devices is flip-chip mounting. Several complex and high-performance circuits, most notably a high speed optical switching chip with over 4000 modulators, have been demonstrated using this technique. In this process individual die are fabricated, diced from the growth wafers, and mounted upside-down on the host substrate using a pick-and-place tool. Once the devices are held into place by solder bonding, the growth substrate is removed by etching.

Because this process involves serial manipulation and alignment of individual device die, it is time consuming and expensive. Additionally, the accuracy obtained with a pick-and-place tool does not allow for fine alignments.

For successful, efficient heterogeneous integration, a process that will align separate discrete die without individual manipulation of the devices is required. There have been two approaches that meet these requirements. These approaches are fluidic self-assembly and vector potential parts manipulation. However, they have there own problems as discussed below.

Fluidic self-assembly is a unique method of assembling many parts in parallel. In this process, carefully etched device die are mated to a substrate with etched holes of matching dimensions. The thick epitaxial devices are lifted-off of the growth substrate, suspended in a liquid solution, and flowed over the host substrate. Driven by gravity and surface forces, the parts align themselves into matching holes in the host substrate. In this process, the alignment tolerance is defined by the etched opening and the shape of the die, rather than by a mechanical alignment. Unfortunately, fluidic self-assembly requires that the device die are made of thick epitaxial layers, which need to be specially shaped to match the openings in the substrate. This requirement is a task that is expensive and difficult to achieve, and typically adds several processing steps, such as ion-milling.

One such fluidic self-assembly is set forth in U.S. Pat. No. 5,824,186 (Smith et al.), U.S. Pat. No. 5,904,545 (Smith et al.), U.S. Pat. No. 5,783,856 (Smith et al.) and U.S. Pat. No. 5,545,291 (Smith et al.), all of which are incorporated herein by reference. The fluidic self-assembly described in the aforementioned patents include a step of transferring the shaped blocks into a fluid to create a slurry. The slurry is then dispensed evenly or circulated over the top surface of a substrate having recessed regions thereon. The microstructure via the shape and fluid tumbles onto the surface of the substrate, self-aligns, and engages into a recessed region.

Fluidic self-assembly using either recessed pits or capillary forces provides the advantage of a parallel assembly process with efficient material usage, but relies on "the law of large numbers" to assemble parts, because it is essentially a random process requiring an overabundance of parts for successful assembly. While this works well on dense arrays, it does not offer significant advantages for more sparse arrays of parts.

Another process that allows for the alignment of separate device die is potential-driven assembly. This process uses a potential, most often electrostatic, to direct and place parts. Parts are placed on a vibrating stage and are attracted to potential wells on the substrate. As the vibration is reduced, the parts "anneal" into place. This is a very promising technique, but it has only been demonstrated with large parts and with extremely high voltages in a specially prepared alignment fixture. U.S. Pat. No. 5,355,577 (Cohn), incorporated herein by reference, discloses one such potential-driven assembly process, wherein devices are placed randomly on a template consisting of a pair of oppositely charged planar electrodes. The upper electrode contains a multiplicity of apertures. The template is vibrated and the devices are attracted to the apertures and trapped therein. The shape of a given aperture determines the number, orientation, and type of device that it traps. The process is completed by mechanically and electrically connecting the devices.

All of these applications, while suitable for specific applications, do not allow for true, versatile heterogeneous integration of three-terminal III-V devices. A process needs to be developed that will be flexible, use epitaxial material efficiently, and place and align devices in parallel.

The present inventors have discovered an unique process electro-fluidic assembly process that is capable of placing and aligning individual electronic devices onto predetermined locations of a substrate, and capable of avoiding the problems with the conventional processes discussed above. The electro-fluidic process according to the present invention is capable of true monolithic integration which allow for the production of designs with low parasitic electrical interconnects and low thermal resistance contact to silicon substrates. In order to improve upon these techniques, we have developed a driven fluidic assembly process called "electro-fluidic assembly". In this process, device die are suspended in a fluid carrier and aligned to an electrode structure utilizing electric fields. This technique utilizes two effects: dielectrophoresis and electrostatic energy minimization. Dielectrophoresis drives parts over long ranges while electrostatic energy minimization provides short-range alignment. By utilizing these two forces, the present inventors have demonstrated that electronic devices can be drawn to alignment sites and accurately aligned in parallel with a single process step.

Because this process uses directed assembly to position and align parts, it provides faster, more efficient alignments than the essentially random fluidic assembly processes described above. Also, because electric fields and electro-hydrodynamic effects are used to physically move the parts, the devices can be any arbitrary shape or material, rather than the carefully machined shapes required by fluidic-self-assembly.

The unique assembly process according to the present invention will enable true heterogeneous, monolithic circuits to be fabricated rapidly, on an arbitrary substrate, with low cost.

The present invention also provides many additional advantages which shall become apparent as described below.

SUMMARY OF THE INVENTION

An electro-fluidic assembly process for integration of components, e.g., electronic devices, onto a substrate which comprises: dispensing components within a carrier fluid; attracting the components to an alignment site on the substrate by means of eletrophoresis or dielectrophoresis, which is the motion of a particle in solution when exposed to a electric fields; and aligning the components within the alignment site by means of electrostatic energy minimization, with the alignment site designed such that the ideal alignment position is the component's preferred alignment.

The carrier fluid is a fluid, such as: water, alcohols, and organic solvents. Examples of components include any electronic, optical, or microelectromechanoical devices fabricated from a combination of electronic materials, such as silicon, germanium, carbon, gallium, indium, aluminum, arsenic, phosphorous, nitrogen, and mixtures thereof. Examples of potential substrate materials include: silicon, ceramic, duroid, and metals.

The substrate comprises: a biased backplane layer, a metal plane layer having an alignment site, a first insulating layer disposed between the backplane layer and the metal plane layer, and a second insulating layer, e.g., a benzocyclobute layer, having a recess disposed therein, wherein the second insulating layer is on the surface of the ground metal plane layer opposite from the first insulating layer and wherein the recess is in communication with the alignment site.

The means of dielectrophoresis comprises the application of an electric field between the backplane layer and the metal plane layer, wherein the electric field is in the range between about 1 V/cm to $10^{10}$ V/cm.

The present invention further comprises a substrate for use in electro-fluidic assembly, wherein the substrate comprises: a biased backplane layer, a metal plane layer having one or more alignment sites, an first insulating layer disposed between the backplane layer and the metal plane layer, and an upper insulating layer having a recess disposed therein, wherein the second insulating layer is on the surface of the metal plane layer opposite from the first insulating layer and wherein the recess is in communication with the alignment site.

The biased backplane layer is form from at least one material selected from the group consisting of: doped semiconductor, metals, and conducting polymers. The metal layer formed from at least one material selected from the group consisting of: gold, gold, aluminum, palladium, titanium, copper, platinum, tantalum, doped semiconductor. The insulating layer at least one material selected from the group consisting of: $SiO_2$, $Si_3N_4$, glass, polymers, and vacuum.

Other and further objects, advantages and features of the present invention will be understood by reference to the following specification in conjunction with the annexed drawings, wherein like parts have been given like numbers.

BRIEF DESCRIPTION OF THE DRAWINGS

FIG. 11(a) is a cross-section and top view of the electrode structure used in the electro-fluidic assembly process according to the present invention;

FIG. 11(b) is a SEM image of the fabricated electrode structure according to the present invention;

DESCRIPTION OF THE PREFERRED EMBODIMENTS

The present invention provides a unique process that can be used to place and align individual pieces onto predetermined locations onto an arbitrary substrate using electric fields in a fluid. An electric field will produce several effects on a particle within the field. If the particle has a net charge, a force will be generated on the particle according to the charge on the particle and the direction of the field. This force is known as electrophoresis, and applies in both non-uniform and uniform DC fields, but not AC fields. If the particle is neutral, it will experience no net force in a uniform field. However, the field will induce a dipole moment in the particle. A non-uniform electric field will cause a net force in the direction of increasing electric field for a conducting die in a polar medium. This force, which exists for both non-uniform AC and DC fields, does not depend on any net charge on the piece, but rather on the charge separation and the field non-uniformity. This phenomenon is known as dielectrophoresis.

Figure 1:
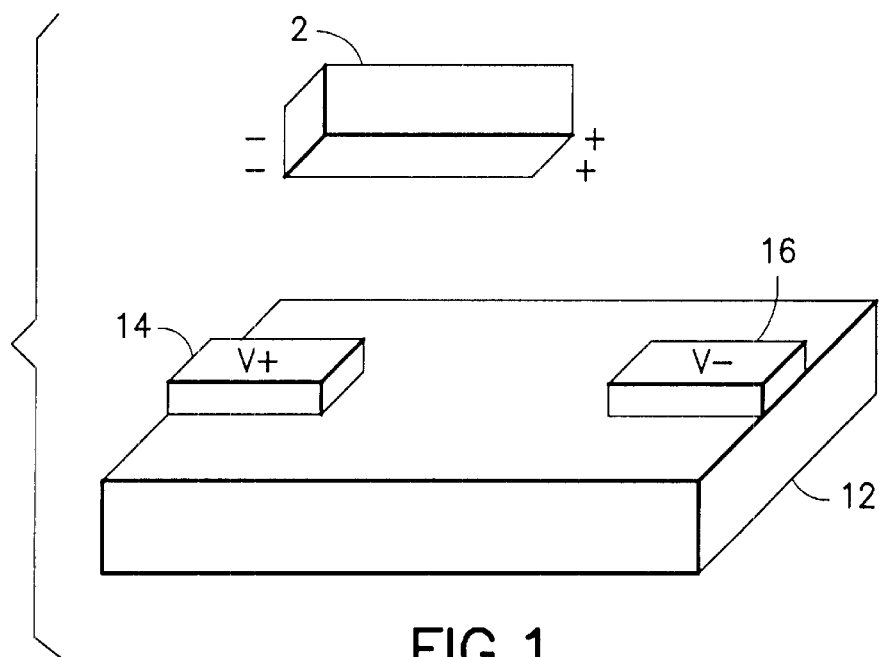
FIG. 1 is a schematic representation of the electro-fluidic process according to the present invention wherein a charged electronic device is being aligned between a pair of coplanar metal fingers.
Figure 2:
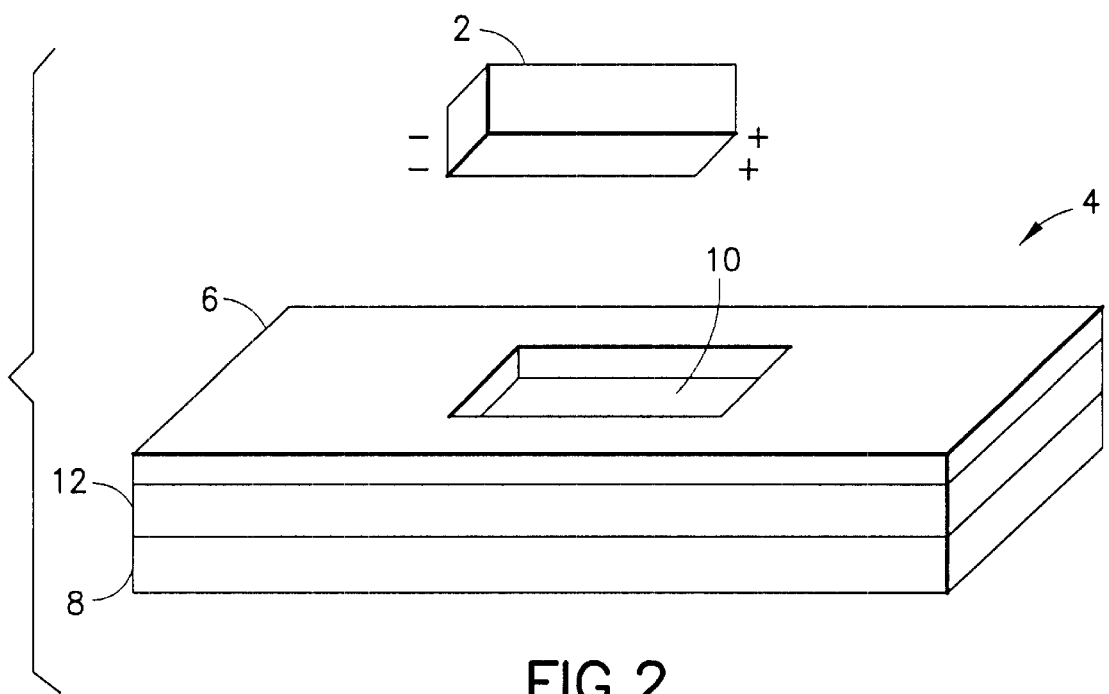
FIG. 2 is schematic representation of an alignment electrode of the present invention with an aperture in a metal plane.

In order to perform the alignment, a substrate as shown in FIGS. 1 and 2, which may or may not have pre-processed circuitry on it, must be prepared to create sites to which the die 2 will be attracted. In order to do this, an electrode structure 4 is fabricated on the substrate, not shown. Electrode structure 4 creates electric fields that will attract device die 2 from within the solution. The electrodes (6 and 8) are designed so that when die 2 has been aligned to a given site 10, the field will be shielded and no more particles will be attracted to site 10. Also, an insulating layer 12 prevents electrodes 6, 8 from being short-circuited by die 2. Two possible examples of electrode structures 4 are two coplanar metal lines 14, 16 underneath insulator 12, which the parts will span (FIG. 1), and an opening in a metal plane 6 parallel to and insulated from another, differently biases conducting plane 8 (FIG. 2).

Figure 13:
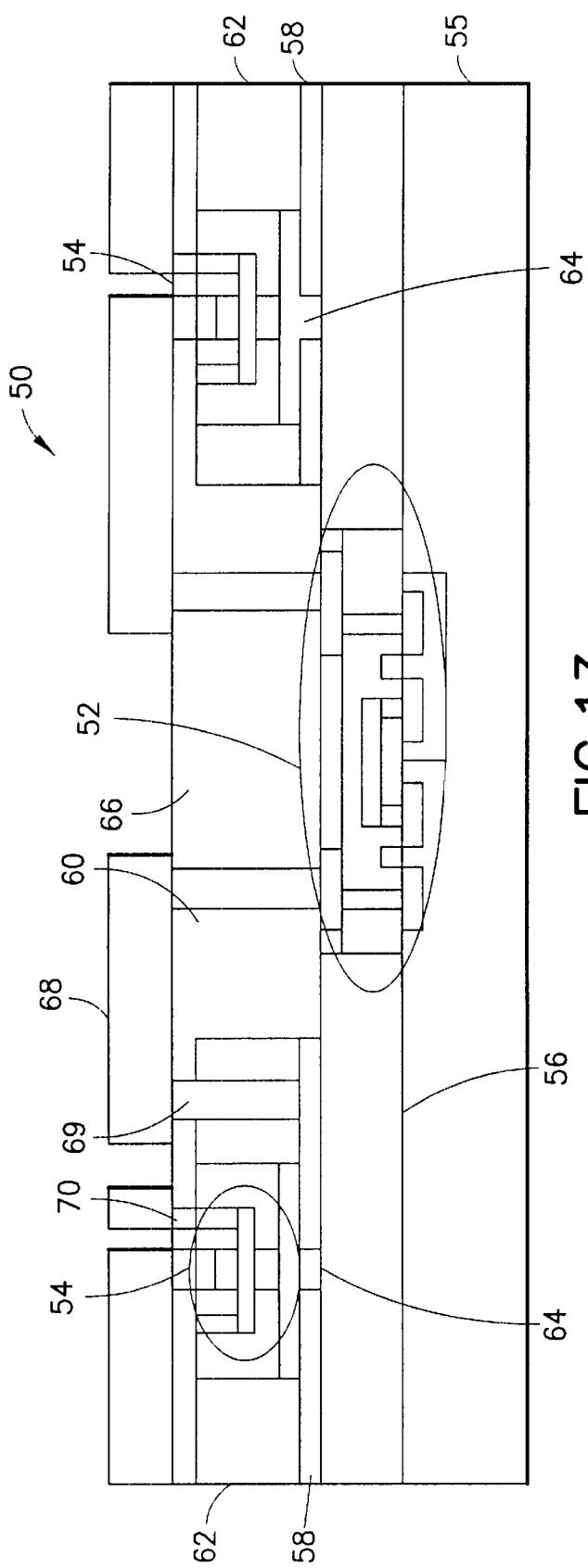
FIG. 13 is a schematic cross-sectional representation of a heterogeneous integrated circuit structure formed using the electro-fluidic assembly process of the present invention.

After the parts have been aligned and placed on the wafer, they will be permanently bonded to the host substrate, and any additional cleaning or processing, such as dielectric, passive device, or interconnect fabrication, that is required to complete the heterogeneous circuit can be performed as discussed in FIG. 13 herebelow.

In order to facilitate the motion of the particles, mechanical agitation can be provided to the entire system of substrate, fluid, and suspended die. This agitation, which can be provided by stirring, shaking, circulation, vibration, flowing, or a combination of these excitations, encourages the die to move around until they are "trapped" by an alignment site. However, a common problem in micro-assembly applications is adhesion between parts or between parts and the substrate. In order to avoid this, both the die and substrate may be treated with a coating, such as a self-assembled monolayer or multi-layer polyelectrolyte, that modifies the surface functionality and prevents adhesion.

The electro-fluidic assembly process according to the present invention has four steps that are shown schematically in FIGS. 10a–d. The four steps are: (a) growing and etching the III-V devices or small circuits 20 on a growth substrate 22, (b) removing devices or circuits 20 from growth substrate 22, (c) suspending devices 20 into a carrier fluid, and (d) placing and aligning devices 20 using at predefined locations on silicon (Si) substrate 24 with electric fields, as discussed herebelow. After assembly, thin III-V devices 20 can be integrated monolithically with the existing Si circuitry by completing the back-end process, which consists of dielectric and metal interconnect deposition.

Because electric field assisted assembly forms the basis of this integration process, we will begin by discussing the mechanisms responsible for electro-fluidic alignment and one electrode structure that can be used to create a suitable nonuniform electric field in the carrier fluid. An electric field can induce two primary forces on a particle suspended in a dielectric medium. One force is due to the attraction or repulsion of charged particles by the electric field, and is known as electrophoresis. The second force results from the electric field inducing a dipole moment on the particle. When the particle is more polarizable than the dielectric medium, it will experience a net force in the direction of increasing field strength when the particle is placed in a nonuniform electric field.

In order to demonstrate that the effect of the long-range dielectrophoretic forces on Au die placement, we designed an electrode structure that produces a nonuniform electric field with a gradient suitable for aligning the Au die to predefined locations on the Si substrate. The design consists of a series of apertures that are defined in a metal ground plane, which is on top of and electrically insulated from a biased backplane. While apertures of arbitrary shape could be used, our initial work has been done using circular apertures to remove undesired effects of field crowding at sharp edges. As shown in FIGS. 11a–b, biased backplane 30 was a n$^+$-Si substrate metallized with Al, and insulating layer 32 that separated metal ground plane 34 from backplane 30 was a 2 $\mu$m thick layer of thermally grown SiO$_2$. Aperture 36 having a 20 $\mu$m diameter was defined in a 50 nm Ti/100 nm Au metal ground plane 34 using metal liftoff (not shown). An additional 10 $\mu$m thick layer of Benzocyclobute (BCB) 38 was deposited on top of metal ground plane 34, and a 200 $\mu$m diameter recess 40 that surrounded aperture 36 was etched with a CF$_4$/O$_2$ plasma. Recess 40 was included in this design to capture and hold the Au die following initial placement by the electric-field induced dielectrophoretic forces.

In order to utilize dielectrophoresis, an electrode structure that appropriately concentrates the fields must be designed. The present invention utilizes an electrode design having apertures in a ground plane over an electrically biased plane. This design allows the use of a doped substrate as the backplane, and thermally grown silicon dioxide as the dielectric. A 2 $\mu$m thick oxide allows for the use of voltages over 1000 V.

The substrate design includes small aperture 40 in metal ground plane 34 to concentrate the field, and recess 40 in a thick BCB layer 38 designed to trap and hold the piece once the electric field has drawn it to the opening.

To demonstrate this technology, a feasible process for fabricating InP-based devices and freeing them from the substrate was used. This process, which is based on extensive process development for GaAs/AlGaAs, GaAs/InGaP, and InP/InGaAs HBTs, provides individual, discrete InP devices that can be released into solution and aligned using electro-fluidic alignment. Initially, dummy die were fabricated out of plated gold to demonstrate the alignment process.

As an initial demonstration of the electro-fluidic alignment, dummy gold die was used to simulate the freed InP devices. These 8 $\mu$m thick gold die are fabricated by electroplating on top of a photoresist release layer and then released into acetone. Once the die have been released into the acetone, they are rinsed several times in acetone, then IPA and finally, water. After cleaning, the die were be treated with a self-assembled monolayer or poly-electrolyte to prevent adhesion and agglomeration. Because the die are the same shape and thickness of the gold support layer that will be plated on the III-V devices, the imitation die behaved similarly to the actual devices.

Simple diodes fabricated out of InP-based material allow for the development of the substrate removal, die attach, and interconnect process, without the unnecessary process complexity involved in fabricated actual HBTs. These devices are simple circular devices, large enough so that additional dielectric and interconnect steps are not needed. The large top contact is formed by electroplating gold and tin on top of the upper epitaxial layer. The gold-tin solder will be reflowed to form Au/Sn 80/20 eutectic solder. Then, the entire substrate is fastened to a silicon substrate using cyanoacrylate adhesive. The substrate is then removed in 50% hydrochloric acid, which stops selectively on the InGaAs epitaxial material. Once the substrate is removed, backside contacts are formed by lift-off and evaporation, and the devices will be isolated by etching through the remaining epitaxial layers. The wafer with the attached devices is then soaked in acetone to dissolve the adhesive and release the devices. The devices are then cleaned and treated to prevent adhesion, in the same fashion as the gold die.

Following cleaning, the devices are aligned to the alignment substrate using electro-fluidic assembly according to the present invention. The solvent evaporates, while the alignment substrate remains under electrical bias. The entire substrate is then transferred to a hotplate and heated to 300° C. to melt the solder and fasten the devices. The substrate is cleaned, a layer of BCB is spun to fill the gaps between the diodes and the recess sidewalls, via holes will be etched, and a layer of interconnect is deposited. After the assembly is complete, diodes are tested to demonstrate the die attach and interconnect procedure.

Once the diodes are aligned and tested, the more complex HBT process is performed. The DHBTs are then grown, and initial materials characterization are performed as part of a concurrent device program. The HBTs will be fabricated using a 2 $\mu$m self-aligned, transferred-substrate process originally developed for GaAs/AlGaAs HBTs, but easily transferred to InAlAs/InGaAs/InP HBTs by adapting etchants developed specifically for InAlAs/InGaAs/InP DHBTs. Rather than being optimized for ultra-high-speed performance, this flip-chip process is optimized for power performance, with thermal management particularly emphasized.

The HBT process begins with the patterning, evaporation and lift-off of an emitter contact. The self-aligned emitter mesa is etched using the contact as a mask, and self-aligned base metal is patterned, evaporated, and lifted-off, leaving a sub-micron separation between the emitter and base contact. The entire wafer is then spun in BCB to a thickness of 1 µm, with excellent planarization. The BCB is then etched back to reveal the emitter mesa, which is 0.6 µm high. The BCB is removed from the regions outside of the active device, seed metal is sputtered onto the wafer, and the gold bumps, which double as thermal shunts, are plated over the entire device die, with separations between die. The device is then attached to a carrier wafer using cyanoacrylate cement, and the substrate is etched away, revealing the InGaAs subcollector. The collector contact is evaporated from the backside, and the HBT device layers are etched away in the regions outside of the active devices to isolate the devices. Next, another layer of BCB is spun onto the HBT wafer to provide a dielectric layer for interconnects. Via openings to the collector and base contact are made, and ring-shaped contacts are formed to allow for angular misalignment. For common-emitter devices, the emitter contact will be made through the solder connection to the ground plane. In the event the emitter is not grounded in the circuit, a dielectric layer will remain between the emitter and ground plane, and the emitter contact will be accessed through a via opening.

After the devices are fabricated on the surrogate substrate, they can be tested for yield and performance. Then they will be released into solution by dissolving the adhesive in acetone, and the assembly will be completed in the same way as described for the diodes.

Figure 12:
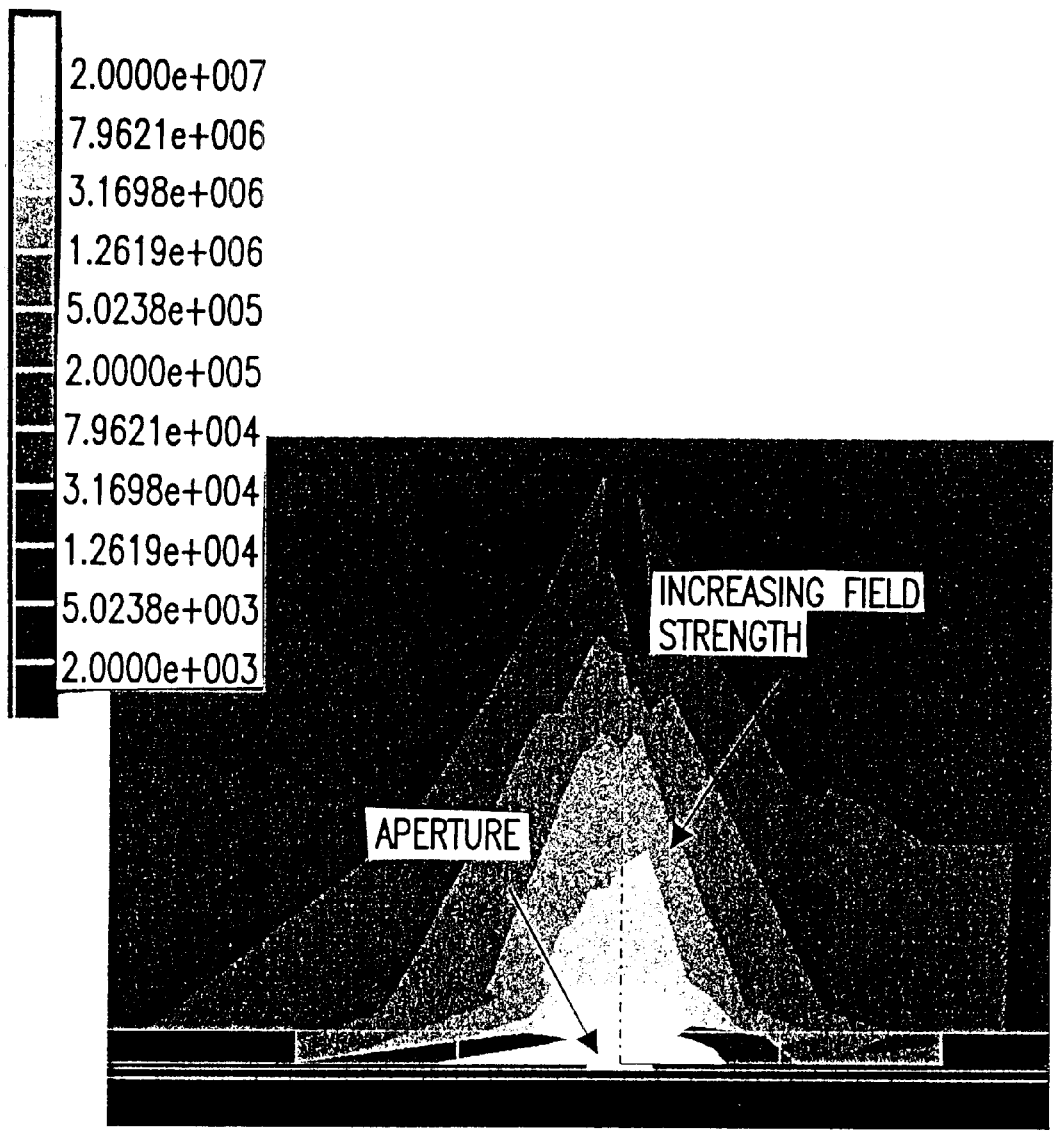
FIG. 12 is a graph depicting the electric field profile within the carrier fluid at a bias of 400 V.

The electric field distribution within the carrier fluid was determined by simulating the field profile of this substrate configuration using a commercially available 3-D field simulator. We used the dielectric constant of isopropanol, which served as the carrier fluid in all of our experiments. FIG. 12 is a cross-sectional plot of the simulated electric field distribution at a substrate bias of 400 V. For reference, the 20 µm diameter aperture in the metal ground plane is centered at the midpoint of the plot. The darkest regions correspond to the lowest field strength, while the lightest regions have the highest field strength. From FIG. 12, it is evident that there is a large positive gradient in the electric field directed towards the center of the aperture. Because the dielectrophoretic force moves particles in the direction of increasing field strength, this design should result in a net movement of the Au die from the carrier fluid towards the aperture in the ground plane.

FIG. 13 depicts heterogeneous integrated circuit 50 according to the present invention which comprises a CMOS circuit 52, as well as at least one III-V transferred device 54 disposed on silicon substrate 55. The CMOS process will be a standard CMOS process; the only modification required for the heterogeneous integration is that space will need to be left for the placement of the actual devices. After the CMOS fabrication is finished through the entire process, a layer of thick dielectric (e.g., field oxide 56) will be spun onto the entire surface of substrate 55, then etched away in all of the regions except over CMOS device 52. The purpose of this polyimide layer 56 will be to protect CMOS device 52 from the high fields in the electro-fluidic alignment; in the alignment areas of the device, the field oxide 56 will provide the dielectric for the alignment. Next, a metal ground plane 58 will be deposited on top of that, with openings providing the alignment sites for III-V devices 54. After metal ground plane 58 is deposited, a layer of BCB 60 will be spun on top of it to provide a thick layer for the alignment recess 62 and circuit dielectric. Alignment recess 62 will be etched in layer of BCB 60, with photoresist hardbake providing a sloped sidewall for recess 62.

At this point, CMOS wafer 50 will be placed into a jig (not shown) that contacts both the upper ground plane (not shown) as well as the doped substrate 55. The wafer 50 will be biased, and the III-V devices 54 will be aligned to the alignment sites 64 and held in place by the electric field and recess 62 until the solvent dries. At this point, wafer 50 will be heated on a hotplate to melt the solder in order to attach devices 54 as well as make an electrical bond from devices 54 to metal ground plane 58.

After devices 54 are permanently attached to silicon substrate 55, metal ground plane 58 and layer of polyimide 56 will be stripped in the region over CMOS device 52, revealing CMOS device 52. Then a layer of BCB 66 will be spun on the entire sample in order to fill in the gaps between III-V device die 54 and recess 62 as well as the areas over CMOS circuitry or device 52. At this point, vias will be etched into layer of BCB 66, possibly in separate steps for holes 69, 70 with different depths. Any vias that need to extend down through metal ground plane 58 will be etched through gold layer 58, and then down through final dielectric layer 56 to make contact with CMOS circuits 52. Finally, gold interconnect lines 68 will be plated on the entire circuit 56, providing a low-loss microstrip wiring environment over an ideal metal ground plane 58. A diagram of the intended structure is shown in FIG. 13.

This process will monolithically combine the data processing capabilities of Si CMOS circuitry, as well as the high frequency performance of III-V devices. Additionally, an ideal microstrip wiring environment is obtained, with a high conductivity ground plane and a low-loss dielectric.

EXAMPLE 1

As a demonstration, we study this approach by aligning gold die to a pre-patterned silicon substrate. The die, which resemble released epitaxial devices such as transferred substrate HBTs, are 150 µm square and 3 µm thick. The die are electroplated on top of photoresist and then released into solution. The loose die are then cleaned and chemically functionalized with a multilayer polelectrolyte process to prevent aggregation in the carrier solution.

Figure 3:
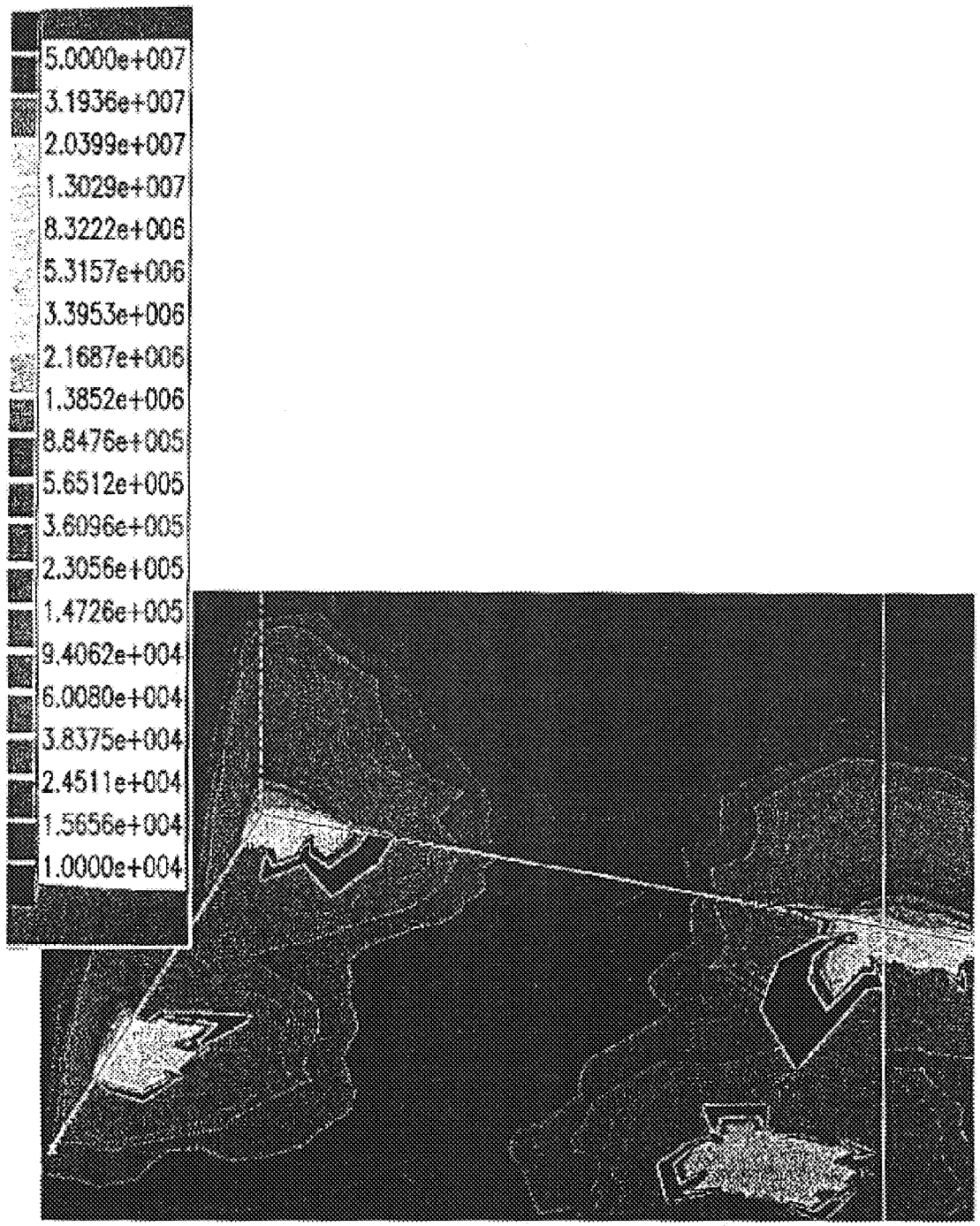
FIG. 3 is a graph that simulates the field surrounding the aperture shown in FIG. 2.
Figure 4:
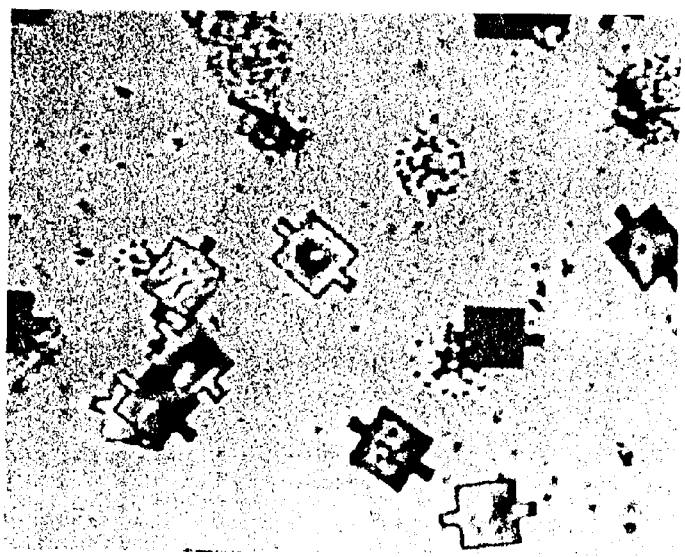
FIG. 4 is a SEM image showing that prior to alignment, the substrate is treated to prevent adhesion of the gold die to the substrate.
Figure 5:
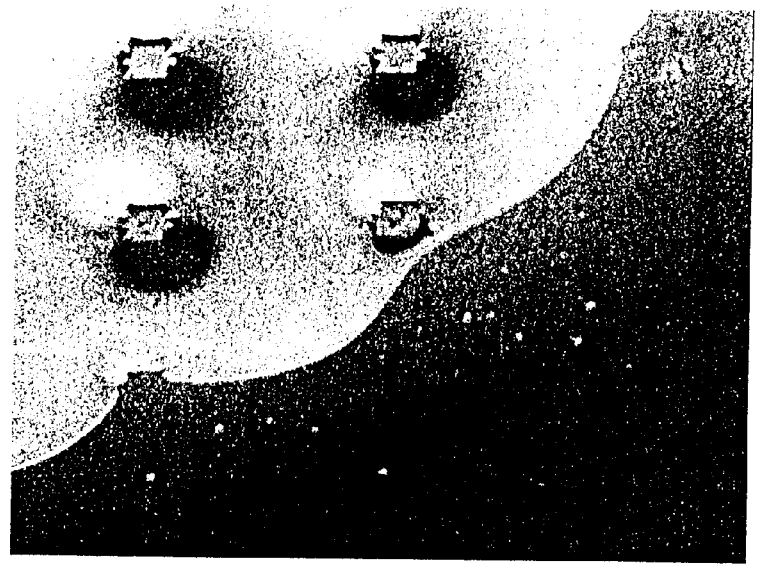
FIG. 5 is a SEM image showing a thin BCB layer that has been selectively treated with a plasma to modify the alignment sites in order to prevent the adhesion of gold die to the substrate, i.e., the BCB layer is treated to be hydrophobic in the alignment sites and hydrophilic in the substrate field.

The n+ silicon substrate has a 250 nm thick metal layer on top of a dielectric layer. Apertures are defined in the metal layer by lift-off, leaving holes that are roughly the same size and shape as the die. When a bias is applied between the metal and the n+ substrate, the electric field is concentrated at these apertures, which will then act as alignment sites. A simulation of the field surrounding the aperture is shown in FIG. 3. Prior to alignment, the substrate is also treated to prevent adhesion of the die to the substrate, which is shown in FIG. 4. In order to prevent this adhesion, a thin BCB layer was selectively treated with a plasma to modify the alignment sites. An example of this is shown in FIG. 5, with the alignment sites treated to be hydrophobic, while the substrate field is hydrophilic.

Figure 6:
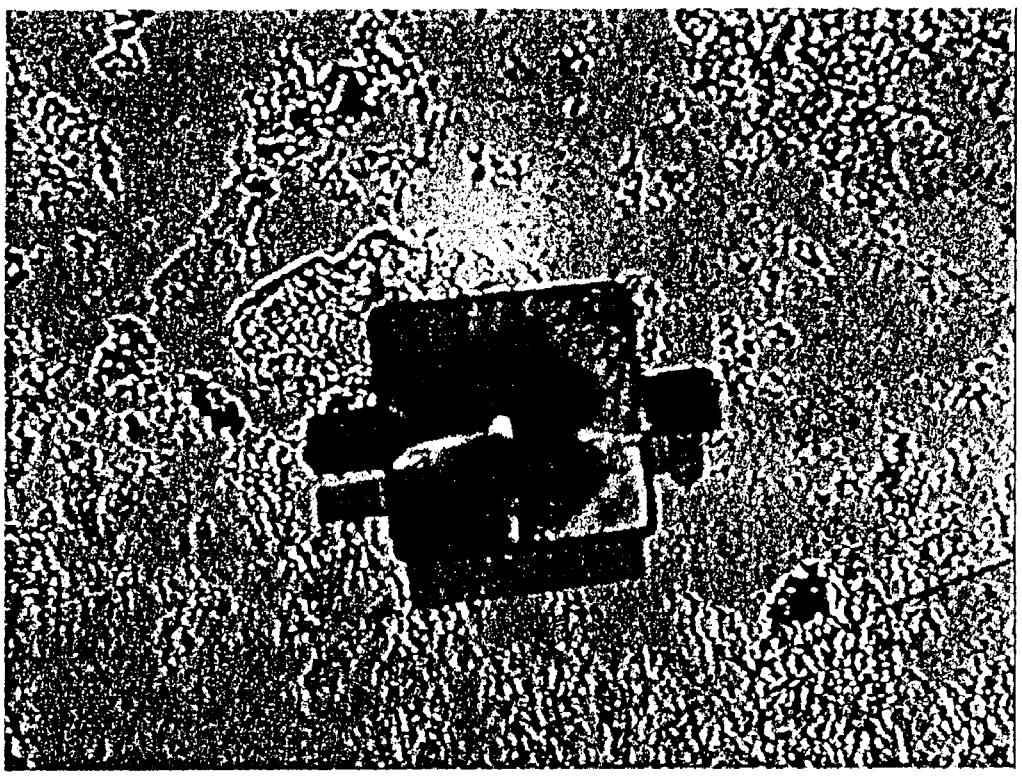
FIG. 6 is a SEM image of a gold die aligned to an aperture in a metal plane.
Figure 7:
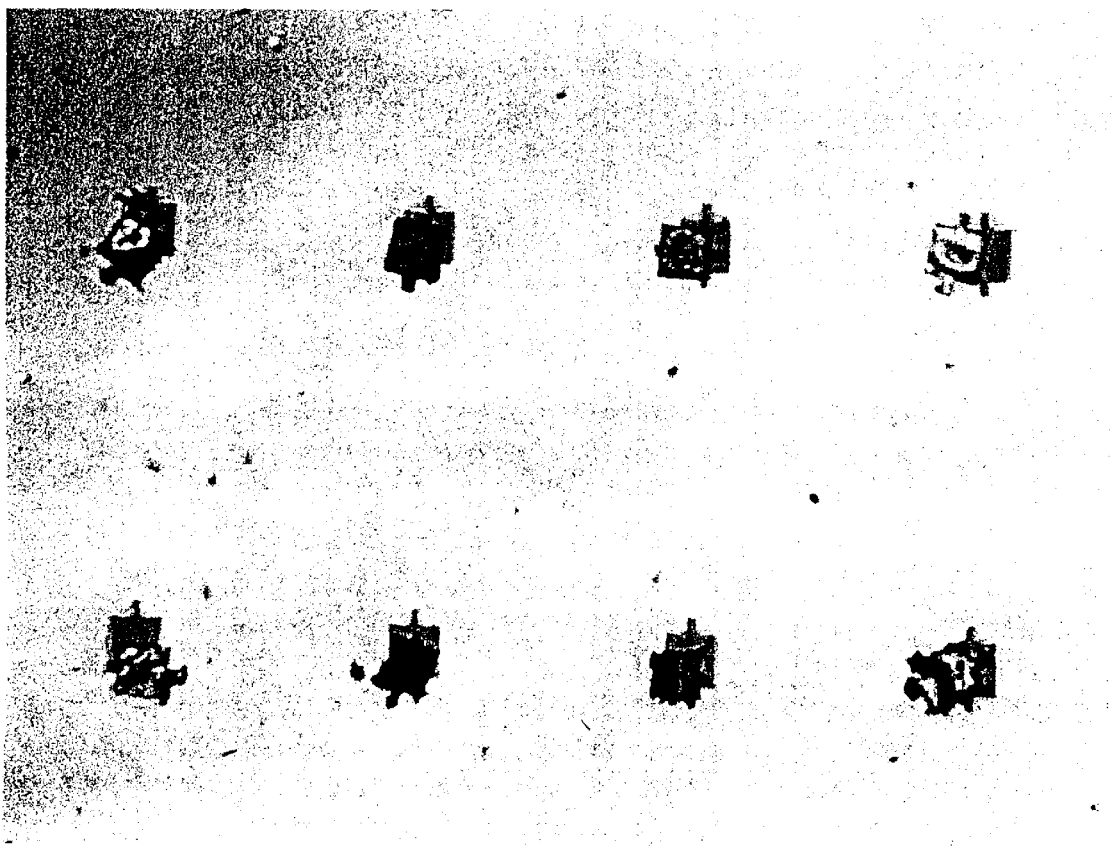
FIG. 7 is a SEM image of eight gold die positioned on a substrate using the electric field alignment procedure according to the present invention.
Figure 8A:
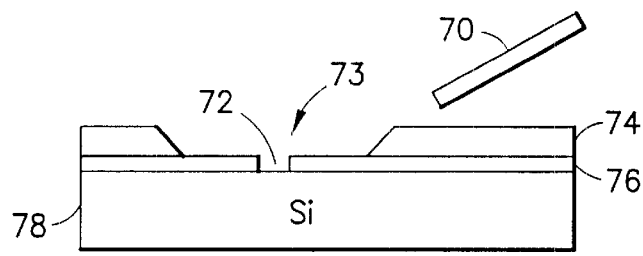
FIGS. 8a–d is a schematic representation of the electro-fluidic alignment process according to the present invention, wherein step (a) uses dielectrophoretic forces to cause high frequency excitation attraction of gold die to alignment site or aperture, step (b) holding the gold die at an outer edge of the recess (i.e., alignment site or aperture) at high frequencies, step (c) imparting a low frequency pulse train to cause the random walking of the gold die into the recess, and step (d) conducting final alignment of gold die to aperture.
Figure 8B:
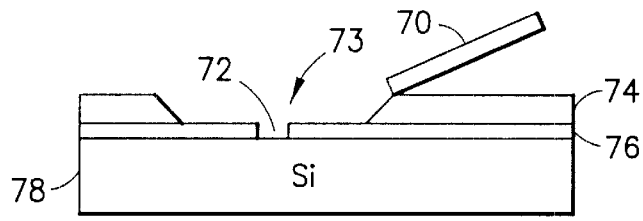
Figure 8C:
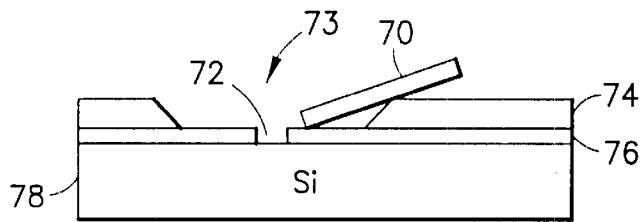
Figure 8D:
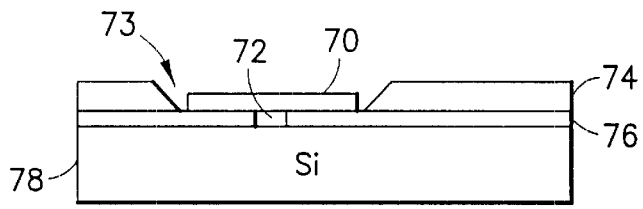

During the alignment procedure, the solution containing the gold die is dispensed onto the substrate, and the substrate is agitated to randomly excite the die. As a die moves past an alignment aperture, the electric field from the bias voltage causes the die to become electronically polarized. The polarization causes an electrostatic attraction towards the regions of high field, moving the die towards the apertures. With properly matched apertures and gold die, we have obtained translational alignment of better than 20 microns and rotational alignment of better than 15 degrees, as seen in FIG. 6. Also, we have obtained 4×2 arrays of positioned (but not aligned) blocks using this procedure, as shown in FIG. 7.

EXAMPLE 2

This electro-fluidic alignment experiment utilized a thin Au die in place of substrate-free III-V devices due to our ability to process large quantities of Au die inexpensively and rapidly. Because the Au die are approximately the same shape and thickness as the bottom metal that will ultimately be plated on the III-V devices, the imitation die should respond to the field in a fashion similar to the actual devices. The die were fabricated by electroplating 8 μm of Au into a form defined by MicroChem SU-8 photoresist. After removing the Au die from the sacrificial substrate, they were rinsed in acetone, isoproponal, and water. To prevent aggregation of the die during assembly, they were coated with a multi-layer polyelectrolyte film, which left the surfaces of the die charged negatively. The Au die were then re-suspended in isopropanol, which served as the carrier fluid in all of the assembly experiments.

The substrate used to investigate the electro-fluidic assembly process consists of an 8×12 array of apertures, where the spacing between adjacent apertures is 750 μm. During the assembly process, the substrate was placed in a Teflon holder and electrical contact was made to the top metal ground plane and the backplane using flexible metal clips. The carrier fluid that contained the Au die was added to the holder until it covered the substrate completely. Electrical excitation was produced with a function generator stepped up by a transformer, providing a 400 $V_{p-p}$ sinusoid with a frequency adjustable from 10 Hz to 2 kHz. At frequencies below 10 Hz, the electrical circuit produced a train of pulses. Orbital and/or angular agitation was supplied during assembly to mobilize the Au die in the carrier fluid. After the alignment was complete, the mechanical agitation was removed and the carrier fluid was allowed to evaporate. The attractive forces between the Au die and the substrate were strong enough to hold the die in the recess while the carrier fluid evaporated.

The frequency dependence of electro-fluidic assembly was studied by fixing the voltage at 400 $V_{p-p}$ and varying the input frequencies between d.c. and 1 kHz. We found that the field-induced movement of the Au die in the carrier fluid at low frequencies was negligible. At frequencies of 1 kHz, the Au die were attracted strongly to the outer edge of the 200 μm diameter BCB recess, where they remained until a low frequency pulse train was applied to the substrate. These low-frequency pulses would first attract the die and then repel the die, which would permit the die to drift along the surface of the substrate. This resulted in a random walk of the Au die towards the center of the Au aperture where the field strength is greatest. This two-frequency electro-fluidic assembly process is outlined in FIGS. 8a–d and was required to (1) create the long-range dielectrophoretic forces required to attract the Au die from the carrier fluid to the Si substrate, and (2) permit the final random walk of the Au die from the BCB recess to the aperture in the metal ground plane. More specifically, FIGS. 8a–d depict the electro-fluidic alignment process according to the present invention, wherein step (a) uses dielectrophoretic forces to cause high frequency excitation attraction of gold die 70 to alignment site or aperture 72, step (b) holding gold die 70 at an outer edge of BCB recess 73 at high frequencies, step (c) imparting a low frequency pulse train to cause the random walking of gold die 70 into the BCB recess 73, and step (d) conducting final alignment of gold die 70 to aperture 72. Aperture 72 is formed within metal ground plane 76 which is disposed between layer of BCB 74 and silicon substrate 78.

Figure 9:
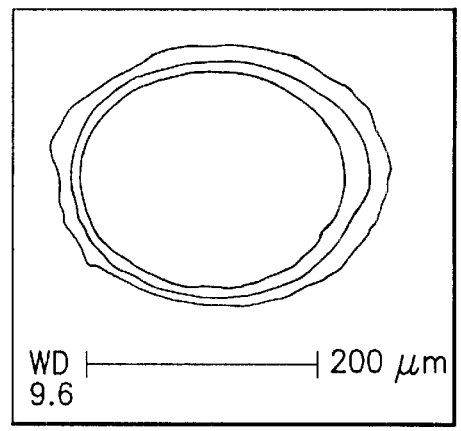
FIG. 9 is a SEM image of a gold die following application of the electro-fluidic assembly process of the present invention.
Figure 10A:
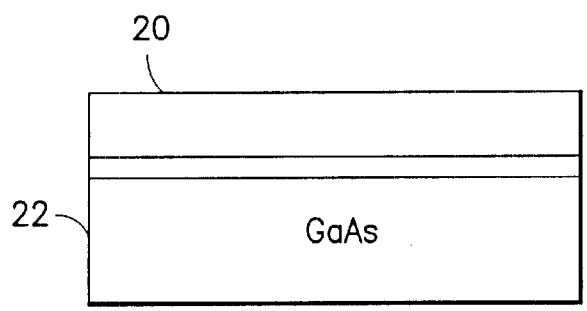
FIGS. 10(a)–(d) is a four step electro-fluid assembly process according to the present invention, wherein step (a) is the growth of device layers on a growth substrate, step (b) is the fabrication of the electronic devices on the growth substrate of step (a), step (c) is the release of the devices from the growth substrate and suspension into a carrier fluid opposite a silicon substrate, and step (d) is the alignment of the III-V devices on the silicon substrate.
Figure 10B:
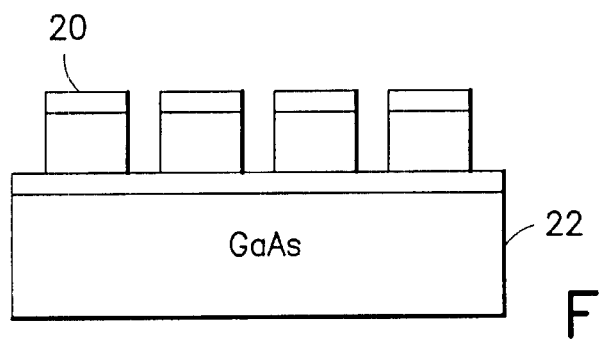
Figure 10C:
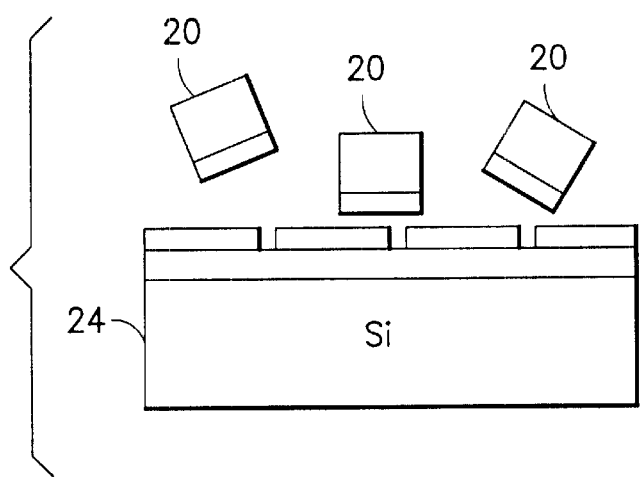
Figure 10D:
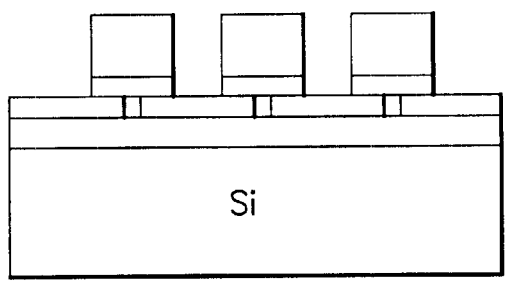

After the Au die were centered in the apertures, the carrier fluid was allowed to evaporate. A scanning electron microscope (SEM) image of a Au die that was aligned in the recess using this electro-fluidic assembly process is shown in FIG. 9. Electrical testing revealed a good contact between the gold die and the substrate, with a measured resistance between the gold die and a test pad equal to that between the metal plane and the test pad.

The increase in field-induced movement with increasing frequency suggests that at low frequencies, the polarization of the dielectric medium surrounding the Au die plays an important role in the field-induced movement. At low frequencies, the polar molecules in the isoproponal dielectric fluid shield the charge separation on the Au die leading to relatively low alignment forces. As the frequency increases, the polar molecules are not able to reorient in the rapidly varying electric field due to their long relaxation times. This results in greater net polarization of the Au die and stronger dielectrophoretic forces. In addition to the strong frequency dependence of the field induced movement, we believe that at high frequencies the motion of the Au die beyond the edge of the BCB recess is limited by the formation of image charge on the surface of the metal ground plane. When a low-frequency pulse train is applied to the sample, the Au die are allowed to drift along the surface of the sample during the off-state of the pulse train.

An electro-fluidic alignment process with applications to HICs has been introduced. The process utilizes nonuniform electric fields to position Au die onto a pre-patterned silicon substrate. High frequency fields were used to attract the Au die from the carrier fluid to the edge of a recess, while pulsed fields were used to draw the Au die into the recess.

While we have shown and described several embodiments in accordance with our invention, it is to be clearly understood that the same are susceptible to numerous changes apparent to one skilled in the art. Therefore, we do not wish to be limited to the details shown and described but intend to show all changes and modifications which come within the scope of the appended claims.

What is claimed is:

1. An electro-fluidic assembly process for integration of a component onto a substrate having thereon alignment sites, said process comprising the steps of:

disposing one or more components in a carrier fluid; and applying an electrical field to induce localized electrohydrodynamic forces to actively attract and direct said components to said alignment sites thereby aligning said components within said alignment sites by means of energy minimization.

2. The process according to claim 1, wherein said carrier fluid is at least one fluid selected from the group consisting of: water, alcohols, or organic solvents.

3. The process according to claim 1, wherein said component is selected from the group consisting of: any electronic devices, any microelectromechanical devices, and optical devices.

4. The process according to claim 3, wherein said component contains material selected from the group consisting of: silicon, germanium, carbon, gallium, indium, aluminum, arsenic, phosphorous, nitrogen, antimony, and mixtures thereof.

5. The process according to claim 1, wherein said substrate is at least one material selected from the group consisting of: silicon, ceramic, glass, or polymer.

6. The process according to claim 1, wherein said substrate comprises: a biased backplane layer, a metal ground plane layer having an alignment site, a first insulating layer disposed between said backplane layer and said metal plane layer, and an second insulating layer having a recess disposed therein, wherein said second insulating layer is on the surface of said metal plane layer opposite from said insulating layer and wherein said recess is in communication with said alignment site.

7. The process according to claim 1, wherein said means of dielectrophoresis comprises the application of an electric field between said backplane layer and said metal plane layer, wherein said electric field is in the range between about 1 V/cm to $10^{10}$ V/cm.

8. The process according to claim 1, wherein said localized electrohydrodynamic forces are selected from the group consisting of: electrophoresis and dielectrophoresis.

9. The process according to claim 1, where said alignment sites are designed to tailor said electrohydrodynamic forces to allow rotational alignment of said components.

* * * * *

UNITED STATES PATENT AND TRADEMARK OFFICE
CERTIFICATE OF CORRECTION

PATENT NO. : 6,687,987 B2
DATED : February 10, 2004
INVENTOR(S) : Mayer et al.

It is certified that error appears in the above-identified patent and that said Letters Patent is hereby corrected as shown below:

Column 1,
Line 5, after the "." and before the word "The" to read as follows;
-- This invention was made with support from the United States Government under the Office of Naval Research, Contract No. N00014-98-1-0846. The Government may have certain rights in this Invention --.

Signed and Sealed this

Twenty-second Day of March, 2005

JON W. DUDAS
*Director of the United States Patent and Trademark Office*